(12) United States Patent
Boyle et al.

(10) Patent No.: US 8,551,792 B2
(45) Date of Patent: Oct. 8, 2013

(54) DICING A SEMICONDUCTOR WAFER

(75) Inventors: Adrian Boyle, Knavinstown (IE); Joseph Callaghan, Dublin (IE); Fintan McKiernan, Carrick on Shannon (IE)

(73) Assignee: Electro Scientific Industries, Inc., Portland, OR (US)

( * ) Notice: Subject to any disclaimer, the term of this patent is extended or adjusted under 35 U.S.C. 154(b) by 128 days.

(21) Appl. No.: 12/989,937

(22) PCT Filed: Apr. 30, 2009
(Under 37 CFR 1.47)

(86) PCT No.: PCT/EP2009/055274
§ 371 (c)(1),
(2), (4) Date: Aug. 9, 2011

(87) PCT Pub. No.: WO2009/133174
PCT Pub. Date: Nov. 5, 2009

(65) Prior Publication Data
US 2012/0064695 A1 Mar. 15, 2012

(30) Foreign Application Priority Data

Apr. 30, 2008 (GB) .................................. 0807780.2

(51) Int. Cl.
*H01L 21/301* (2006.01)
*H01L 21/66* (2006.01)

(52) U.S. Cl.
USPC ............... 438/7; 438/113; 438/462; 438/463; 438/940; 257/E21.599

(58) Field of Classification Search
USPC ........... 438/7, 113, 462, 463, 940, FOR. 387; 257/E21.599
See application file for complete search history.

(56) References Cited

U.S. PATENT DOCUMENTS

| 6,716,362 | B1 | 4/2004 | Benz |
| 7,115,514 | B2 * | 10/2006 | Stoltz .............................. 438/690 |
| 7,169,687 | B2 * | 1/2007 | Li et al. .......................... 438/463 |
| 7,679,030 | B2 * | 3/2010 | Smart ....................... 219/121.68 |
| 7,767,595 | B2 * | 8/2010 | Tanaka et al. .................. 438/795 |
| 2005/0074974 | A1 * | 4/2005 | Stoltz .............................. 438/690 |
| 2005/0274702 | A1 | 12/2005 | Deshi |
| 2006/0088984 | A1 | 4/2006 | Li et al. |
| 2007/0272668 | A1 * | 11/2007 | Albelo et al. ............. 219/121.72 |
| 2007/0293019 | A1 | 12/2007 | Jeng et al. |
| 2007/0293057 | A1 * | 12/2007 | Chism ............................ 438/795 |
| 2008/0138975 | A1 * | 6/2008 | Pratt .............................. 438/618 |

FOREIGN PATENT DOCUMENTS

WO WO 2006/079083 A2 7/2006

OTHER PUBLICATIONS

International Search Report, International Application No. PCT/EP2009/055274.
Herrmann, "Slashing the Costs of High-Precision Micromachining," Photonics Spectra, vol. 38, No. 6, Laurin Publishing USA, Jun. 2004.

* cited by examiner

*Primary Examiner* — George Fourson, III
(74) *Attorney, Agent, or Firm* — Stoel Rives LLP

(57) ABSTRACT

A method of dicing a semiconductor wafer comprises scribing at least one dielectric layer along dice lanes to remove material from a surface of the wafer using a laser with a pulse-width between 1 picosecond and 1000 picoseconds and with a repetition frequency corresponding to times between pulses shorter than a thermal relaxation time of the material to be scribed. The wafer is then diced through a metal layer and at least partially through a substrate of the semiconductor wafer.

24 Claims, 1 Drawing Sheet

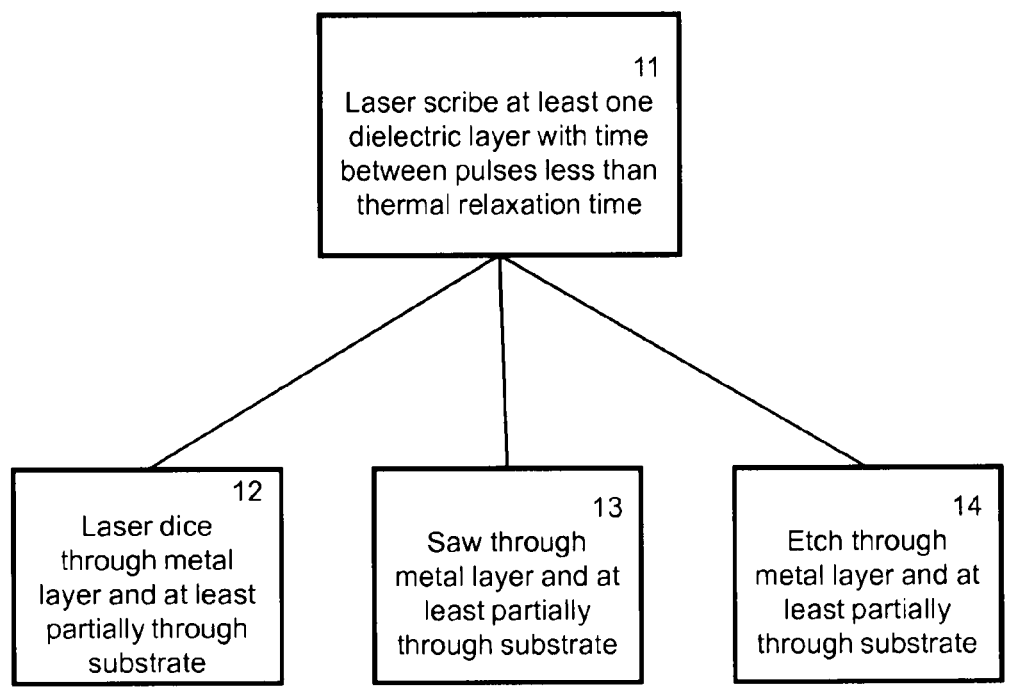

DICING A SEMICONDUCTOR WAFER

RELATED APPLICATIONS

This application is a national stage application under 35 U.S.C. §371 of International Application No. PCT/EP2009/055274, filed Apr. 30, 2009, which claims priority to British Patent Application No. 0807780.2, filed Apr. 30, 2008.

This disclosure relates to a method of dicing a semiconductor wafer.

Laser scribing is well known in which a laser beam is used to remove material from at least portions of dice lanes on a surface of a wafer before using a saw, laser or etcher to singulate the wafer by dicing partially or completely through the wafer in the dice lanes. This process typically involves scribing through different materials including metals, low k dielectric materials and other dielectrics at different locations on the wafer surface.

US 2006/0088984 describes a method for scribing wafers using laser pulses with a short (picosecond) pulse width less than an electron-phonon interaction time of the material being scribed, and a repetition frequency of the laser pulses which is longer than a thermal relaxation time of the material or longer than a plume lifetime, effectively to remove material without thermal damage to the work surface. In embodiments pulse lengths of less than 100 picoseconds (i.e. less than 0.1 nanoseconds) or preferably less than 1 picosecond (0.001 nanoseconds) are used with a pulse repetition frequency of less than 1 MHz. However, suitable lasers with such short pulse widths and relatively long pulse repetition frequencies are relatively expensive.

The inventors have recognized a need at least to ameliorate the aforesaid shortcomings of conventional scribing methods.

According to a preferred embodiment, there is provided a method of dicing a semiconductor wafer comprising: scribing at least one dielectric layer along dice lanes to remove material from a surface of the wafer using a laser with a pulse-width between 1 picosecond and 1000 picoseconds and with a repetition frequency corresponding to times between pulses shorter than a thermal relaxation time of the material to be scribed; and dicing through a metal layer and at least partially through a substrate of the semiconductor wafer.

Advantageously, the repetition frequency is greater than 500 kHz.

Conveniently, the repetition frequency is greater than 1 MHz.

Advantageously, the laser emits an UV laser beam with a wavelength less than 400 nm.

Conveniently, the laser emits a visible laser beam with a wavelength less than 600 nm.

Conveniently, the method comprises scribing a layered structure on the surface of the semiconductor wafer.

Advantageously, the method comprises scribing dielectric materials in the layered structure.

Advantageously, the method comprises scribing low k dielectric materials in the layered structure.

Advantageously, the method comprises scribing high k dielectric materials in the layered structure.

Conveniently, the metal layer is diced using a laser with a repetition frequency in the range 500 kHz to 1 MHz.

Conveniently, the step of dicing comprises dicing with an UV or visible wavelength nanosecond pulse laser with a lower repetition frequency than used for scribing.

Alternatively, the method comprises laser scribing a dielectric layer and then sawing through the metal layer and at least partially through a substrate of the semiconductor wafer.

Conveniently, laser parameters are modified on the fly to machine different materials at different points on the wafer surface.

Conveniently, a position being machined on the wafer is determined from CAD data supplied with the wafer or by machine vision means.

Conveniently, the machining laser is operated at low power and a reflected signal monitored to determine from reflectivity of an illuminated surface a location of a change of material to be scribed so that the machining parameters are changed at the location.

Conveniently, the dicing step is a mechanical saw dicing process.

Alternatively, the dicing step is an etching process.

Advantageously, the method comprises scribing a scribe channel with a width greater than a final dicing lane width to prevent propagation of damage into the wafer from the dicing lane.

Advantageously, the method comprises scribing with a mode-locked laser.

Advantageously, the method comprises scribing with a solid state seed laser or an optical fibre laser source with a semiconductor or optical fibre amplifier.

Advantageously, the method comprises scribing with an optical fibre laser or optical fibre amplifier.

Advantageously, the method comprises scribing with laser pulses with an energy in the range 0.1 µJ 10 µJ.

Advantageously, the method comprises scribing at 50 mm/s to 1000 mm/s.

Conveniently, the method comprises scribing at 200 mm/s to 600 mm/s.

Various embodiments will now be described, by way of example, with reference to the accompanying drawing in which:

FIG. 1 is a flowchart of a multi-step dicing process in which a laser is used to scribe at least one dielectric layer and, thereafter, a laser, saw, or etchant is used to cut through a metal layer and at least part of a substrate.

Laser scribing is a process of using a laser to remove layers from a surface of dice lanes of a wafer before using a saw, laser or etcher to perform full thickness or partial dicing. This process typically involves scribing through multiple materials including metals, low k dielectric materials and other dielectrics at different points on the wafer surface.

The preferred embodiment includes at least two features.

Specifically, the preferred embodiment includes scribing the wafer using a laser that produces a pulse train characterized by: (1) short pulses, of pulse width one nanosecond or less, and (2) a pulse separation of less than one microsecond, i.e. a pulse repetition rate of greater than 1 MHz. Preferably, a mode-locked laser is used to scribe the wafer. These parameters result in an efficient scribe process for many of the materials found on the wafer surface and in most instances a process which machines all materials in the dice lane effectively.

However, specific materials used in semiconductor processing change over time and the prospect remains that some materials will not be machinable efficiently by one set of laser parameters alone. In this instance, using mode locked lasers, it is possible to change laser parameters as a function of position on the wafer. This position may be determined through a wafer inspection step involving machine vision or through CAD data provided with the wafer. It is also possible that the machining laser can be turned to low power and the reflected signal monitored to provide the location of materials with changing reflectivity at which the machining parameters may need to be changed.

Referring to FIG. 1, in one embodiment, where the insulator material is effectively scribed 11 by the laser as described with repetition frequency of >500 MHz and particularly above 1 MHz, the metal may be cut in a subsequent laser dicing process 12 of the wafer. Such laser dicing processes include use of UV and visible nanosecond lasers as well as a lower repetition frequency and short pulse lasers. In short, in this instance the scribe process enables a two (or more) step dicing process by removing insulator and others materials in the dice lane in a scribing process before use of a laser saw 12 or mechanical saw 13 to complete dicing of the metal layers and semiconductor substrate. Alternatively, the semiconductor wafer may be at least partially diced by etching 14.

Typical laser parameters are a repetition frequency >500 kHz, pulse width 20 ps (i.e. 0.2 nanoseconds) and average power >1 W. These power levels are available from fibre mode-locked and fibre amplified lasers. In addition, because these lasers were generally developed for telecoms and microscopy applications, the degree of coherence and low timing jitter that they hold is not essential. Accordingly lower cost seed lasers such as distributed feedback and external cavity diode lasers potentially can be used as sources which can be amplified to the power levels required.

One advantage of the preferred embodiment is that when these pulses are directed to a location on the wafer with a pulse repetition shorter than a thermal relaxation time of the material, surprisingly the thermal contribution to the process may improve the efficiency of material removal and/or reduce a pulse energy required and/or reduce an average power required from the laser. The benefits of this process are, in particular, that the cost of manufacturing the laser required to perform this process is considerably lower than that of a lower repetition frequency laser. In particular the process may be used with solid state diode seed lasers, optical fibre laser sources and semiconductor or optical fibre amplifiers.

EXAMPLE 1

Dielectric Scribing

A dielectric scribed with 1 µJ pulses machined at 100 mm/s with a pulse repetition frequency of 500 kHz, according to a conventional process, showed chipping.

A dielectric scribed with 1 µJ pulses machined at 600 mm/s with a pulse repetition frequency of 5 MHz, according to one embodiment, showed no chipping.

Thus it was found that repetition frequencies greater than 1 MHz gave chip-free scribing at feed rates of 100 mm/s and greater.

EXAMPLE 2

Metal Scribing

A metal layer scribed with 1 µJ pulses machined at 400 mm/s with a pulse repetition frequency of 5 MHz showed melting.

A metal layer scribed with 1 µJ pulses machined at 200 mm/s with a pulse repetition frequency of 1 MHz, according to one embodiment, showed no melting.

Thus if excessive energy is deposited onto a metal area in a short period of time, the metal will melt and burn. It was found that using lower repetition frequencies of 1 MHz or less resulted in a clean scribe of the metal layer, without damage to the surrounding area.

EXAMPLE 3

Metal and Dielectric Scribing

Depending on the wafer pattern and the amount of metals or dielectrics in the streets, it may be possible to machine all areas with a same parameter set.

The wafer stack was composed of a dielectric layer on top of thin metal layers. If a nanosecond laser were used, too much heat would be delivered to the underlying metals, causing them to expand and thus shatter/delaminate the dielectric layer. Using the methods of the preferred embodiment, the high repetition frequency of the fibre laser is used cleanly to scribe the glass material followed by the thin metal layers without any chipping, delamination or melting.

It has been observed that an amount of debris is less and the particles are generally smaller/finer using the method of the preferred embodiment than with a nanosecond process.

In some embodiments using separate scribing and dicing steps, the scribe line is set to be wider than the actual dicing channel for ease of alignment and although some chipping of the dielectric is observable after nanosecond dicing on some areas of the streets, it was never found to extend beyond a width of the scribe. In other words, the scribe can be used to contain any chipping associated with the dicing process.

A suitable fibre laser which is mode-locked at 20 MHz, and subsequently pulse-picked, and therefore very flexible as regards repetition frequency, compared to some other short-pulse laser systems is available from Fianium Ltd. of 20 Compass Point, Ensign Way, Southampton, S031 4RA, United Kingdom. This facilitates changing laser parameters on the fly for machining different materials at different locations on a wafer.

The invention claimed is:

1. A method of dicing a semiconductor wafer comprising:
scribing at least one dielectric layer along dice lanes to remove material from a surface of the semiconductor wafer using a laser comprising an optical fibre laser or an optical fibre amplifier delivering pulses with a pulse-width between about 1 picosecond and about 1000 picoseconds and with a repetition frequency corresponding to times between pulses shorter than a thermal relaxation time of the material to be scribed; and
dicing through a metal layer and at least partially through a substrate of the semiconductor wafer.

2. A method as claimed in claim 1, wherein the repetition frequency is greater than 500 kHz.

3. A method as claimed in claim 1, wherein the repetition frequency is greater than 1 MHz.

4. A method as claimed in claim 1, wherein the laser emits an UV laser pulse with a wavelength shorter than 400 nm.

5. A method as claimed in claim 1, wherein the laser emits a visible laser pulse with a wavelength shorter than 600 nm.

6. A method as claimed in claim 1, comprising scribing a layered structure on the surface of the semiconductor wafer.

7. A method as claimed in claim 6, comprising scribing dielectric materials in the layered structure.

8. A method as claimed in claim 7, comprising scribing low k dielectric materials in the layered structure.

9. A method as claimed in claim 6, comprising scribing high k dielectric materials in the layered structure.

10. A method as claimed in claim 1, wherein the metal layer is diced using a laser with a repetition frequency in the range of about 500 kHz to about 1 MHz.

11. A method of dicing a semiconductor wafer comprising:
scribing at least one dielectric layer along dice lanes to remove material from a surface of the semiconductor wafer using a laser delivering first pulses with a pulse-width between about 1 picosecond and about 1000 picoseconds and with a repetition frequency corresponding to times between pulses shorter than a thermal relaxation time of the material to be scribed; and dicing through a metal layer and at least partially through a substrate of the semiconductor wafer using a UV or visible wavelength nanosecond pulse laser delivering second pulses with a lower repetition frequency than that of the first pulses.

12. A method as claimed in claim 1, comprising laser scribing a dielectric layer and then sawing through the metal layer and at least partially through a substrate of the semiconductor wafer.

13. A method of dicing a semiconductor wafer comprising:

operating a laser at a low power and monitoring a reflected signal to determine from reflectivity of an illuminated surface a location of a change of material to be scribed;

scribing at least one dielectric layer along dice lanes to remove material from a surface of the semiconductor wafer using the laser delivering pulses with a pulse-width between about 1 picosecond and about 1000 picoseconds and with a repetition frequency corresponding to times between pulses shorter than a thermal relaxation time of the material to be scribed and changing laser machining parameters at the location of the change of material; and dicing through a metal layer and at least partially through a substrate of the semiconductor wafer.

14. A method as claimed in claim 13, wherein laser machining parameters are modified on the fly to machine different materials at different points on the surface of the semiconductor wafer.

15. A method as claimed in claim 14, wherein a point being machined on the semiconductor wafer is determined from CAD data supplied with the semiconductor wafer or by machine vision.

16. A method as claimed in claim 1, wherein the dicing step is a mechanical saw dicing process.

17. A method as claimed in claim 1, wherein the dicing step is an etching process.

18. A method as claimed in claim 1, comprising scribing a scribe channel with a width greater than a final dicing lane width to prevent propagation of damage into the semiconductor wafer from the dicing lane.

19. A method as claimed in claim 13, comprising scribing with a mode-locked laser.

20. A method as claimed in claim 11, comprising scribing with a solid state seed laser or an optical fibre laser source with a semiconductor or optical fibre amplifier.

21. A method a claimed in claim 13, wherein the laser comprises an optical fibre laser or optical fibre amplified laser.

22. A method as claimed in claim 1, comprising scribing with laser pulses with an energy in the range of about 0.1 µJ to about 10 µJ.

23. A method as claimed in claim 1, comprising scribing at a feed rate in a range of about 50 mm/s to about 1000 mm/s.

24. A method as claimed in claim 1, comprising scribing at a feed rate in a range of about 200 mm/s to about 600 mm/s.

* * * * *